(12) United States Patent
Grewing et al.

(10) Patent No.: US 8,428,212 B2
(45) Date of Patent: Apr. 23, 2013

(54) FREQUENCY SYNTHESIS USING UPCONVERSION PLL PROCESSES

(75) Inventors: Christian Grewing, Sollentuna (SE); Stefan van Waasen, Kolbermoor (DE)

(73) Assignee: Intel Mobile Communications GmbH, Neubiberg (DE)

(*) Notice: Subject to any disclaimer, the term of this patent is extended or adjusted under 35 U.S.C. 154(b) by 939 days.

(21) Appl. No.: 12/022,957

(22) Filed: Jan. 30, 2008

(65) Prior Publication Data
US 2009/0190708 A1 Jul. 30, 2009

(51) Int. Cl.
*H03D 3/24* (2006.01)
(52) U.S. Cl.
USPC .......................................................... 375/376
(58) Field of Classification Search .................. 375/120, 375/295, 317, 326, 330, 371, 373, 374, 375, 375/376; 331/2, 10, 11, 16, 17, 18, 23, 25, 331/30, 74, 111
See application file for complete search history.

(56) References Cited

U.S. PATENT DOCUMENTS

| | | | | |
|---|---|---|---|---|
| 4,823,399 A * | 4/1989 | George | | 455/192.1 |
| 5,705,955 A | 1/1998 | Freeburg et al. | | |
| 5,726,657 A * | 3/1998 | Pergande et al. | | 342/202 |
| 5,834,985 A | 11/1998 | Sundegard | | |
| 6,369,666 B1 | 4/2002 | Simon et al. | | |
| 6,724,265 B2 * | 4/2004 | Humphreys | | 331/17 |
| 6,933,798 B2 | 8/2005 | Hammes et al. | | |
| 7,030,711 B2 * | 4/2006 | Steinbach et al. | | 331/179 |
| 7,042,253 B2 | 5/2006 | Su et al. | | |
| 7,142,063 B2 | 11/2006 | Grewing et al. | | |
| 7,154,347 B2 | 12/2006 | Grewing et al. | | |
| 7,279,988 B1 * | 10/2007 | Janesch et al. | | 331/10 |
| 7,515,931 B2 * | 4/2009 | Olip | | 455/552.1 |
| 7,610,033 B2 * | 10/2009 | Cowley et al. | | 455/315 |
| 7,746,178 B1 * | 6/2010 | Humphreys et al. | | 331/1 A |
| 7,904,037 B2 * | 3/2011 | Rofougaran et al. | | 455/118 |
| 2003/0210098 A1 | 11/2003 | Shimoda | | |
| 2004/0090277 A1 * | 5/2004 | Tsyrganovich | | 331/74 |
| 2005/0025276 A1 | 2/2005 | Hammes et al. | | |
| 2005/0084034 A1 | 4/2005 | Hammes et al. | | |
| 2005/0170805 A1 | 8/2005 | Hammes et al. | | |
| 2005/0275481 A1 | 12/2005 | Grewing et al. | | |
| 2005/0287967 A1 | 12/2005 | Hung et al. | | |
| 2006/0192620 A1 | 8/2006 | Beaulaton et al. | | |
| 2006/0199622 A1 | 9/2006 | Bhanji et al. | | |
| 2006/0203937 A1 * | 9/2006 | Burgio | | 375/317 |
| 2006/0264195 A1 | 11/2006 | Boos | | |
| 2006/0267695 A1 * | 11/2006 | Keating | | 331/16 |
| 2007/0013451 A1 | 1/2007 | Luzzatto et al. | | |
| 2007/0160164 A1 * | 7/2007 | Sahota | | 375/295 |
| 2008/0153437 A1 * | 6/2008 | Jensen et al. | | 455/126 |
| 2009/0085677 A1 * | 4/2009 | Lewis | | 331/1 A |

FOREIGN PATENT DOCUMENTS

DE 102006041892 A1 4/2007

OTHER PUBLICATIONS

Kern, "Direct digital synthesis enables digital PLLs," RFDESIGN published by electronic design GROUP, Jul. 1, 2007, pp. 26, 28 & 30.
Reinhardt et al, "A Short Survey of Frequency Synthesizer Techniques," 40th Annual Frequency Control Symposium, 1986, pp. 355-365.

* cited by examiner

*Primary Examiner* — David C. Payne
*Assistant Examiner* — Syed Haider
(74) *Attorney, Agent, or Firm* — Eschweiler & Associates, LLC

(57) ABSTRACT

Techniques for frequency synthesis using upconversion PLL processes are described herein.

20 Claims, 5 Drawing Sheets

FREQUENCY SYNTHESIS USING UPCONVERSION PLL PROCESSES

BACKGROUND

The capabilities of mobile communication devices continue to expand. For example, FM (frequency modulation) radio is now available in almost all mobile telephones, personal data assistants, and other suitable devices, allowing users to listen to FM radio broadcasts on their mobile communication devices.

Peripherals like FM radio in mobile communication devices may have very special requirements in terms of reference frequencies. For example, in a "radio only" mode, the high reference frequencies are typically not active to save power, which requires the FM radio to work with a relatively low frequency real time clock (e.g. 32.768 kHz). Alternately, in a "normal" mode, the FM radio is required to work with a high frequency reference (e.g. 26 MHz). This vast range of operational frequencies places considerable challenges on frequency synthesis, including handling the phase noise requirements, the area of a possible integrated loop-filter, and possible requirements on FM transmit functionality with high signal-to-noise ratio (SNR).

Conventional methods of frequency synthesis, such as integer-N phase-locked loop (PLL), software defined phase-locked loop (SDPLL), and frequency-locked loop (FLL), may be used for frequency synthesis depending, for example, on operating circumstances or device design. These alternatives may suffer from drawbacks, however, due to relatively large size (or area) needed for integration due to the requirements for reducing phase noise, particularly for the low reference frequency in the audio bands.

BRIEF DESCRIPTION OF THE DRAWINGS

The detailed description is described with reference to the accompanying figures. The use of the same reference numbers in different instances in the description and the figures may indicate similar or identical items.

DETAILED DESCRIPTION

Disclosed herein are improved techniques for frequency synthesis using upconversion phase-locked loop (PLL) processes that may be used, for example, in modern communication devices. Techniques in accordance with the present disclosure may advantageously improve performance and reliability of such communication devices by improving phase noise behavior and reducing current consumption.

In general, techniques for frequency synthesis taught by the present disclosure may use a stacked, free-running frequency-locked loop (FLL) and phase-locked loop (PLL) approach. In some implementations, a high frequency reference is generated by a high frequency, digitally-controlled oscillator of an FLL portion. The digitally-controlled oscillator may run on a single frequency, and need only be roughly digitally controlled (L bits). The frequency may be a trade-off between area requirements, phase noise, current consumption, and other system requirements (e.g. used frequencies). The high frequency reference may also be influenced by a high frequency reference that may already be available in the system. A reasonable reference frequency for the PLL loop is generated by dividing the oscillator signal down. Since no real analog tuning range is needed using the disclosed stacked FLL-PLL approach, the phase noise behavior may be improved, and the current consumption can be reduced or minimized.

Techniques for frequency synthesis using a stacked free running FLL-PLL approach in accordance with the present disclosure may be implemented in a number of ways. Exemplary systems, circuits, and processes are described in detail below with reference to the included figures.

Exemplary Systems

Figure 1:
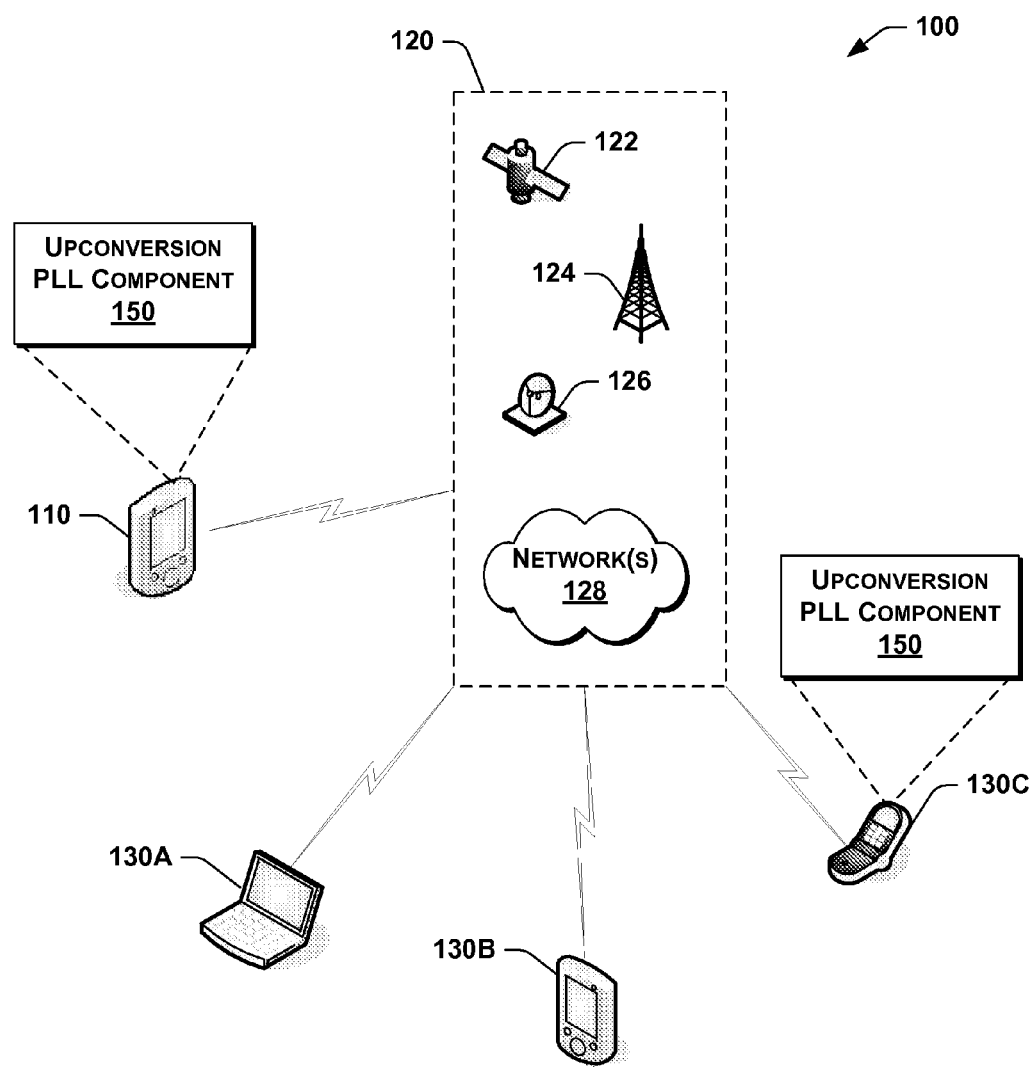
FIG. 1 is an exemplary environment in which techniques in accordance with the present disclosure may be implemented.

FIG. 1 illustrates an exemplary environment 100 in which techniques in accordance with the present disclosure may be implemented. In this implementation, the environment 100 includes a communication device 110 having an upconversion PLL component 150 configured in accordance with the teachings of the present disclosure. Generally, the upconversion PLL component 150 may function as a frequency multiplier (as needed) which multiplies a reference input signal by a division ratio to produce a relatively higher frequency output signal. The output signal is therefore locked to the reference input signal. The upconversion PLL component 150 may include hardware, software, and firmware components, as described more fully below.

In this implementation, the communication device 110 operatively communicates via an infrastructure 120 with one or more other communication devices 130. Alternatively, the communication device 110 may bypass the infrastructure 120 and communicate directly with one or more of the other devices 130. Detailed descriptions of various aspects and implementations of the upconversion PLL component 150 are provided in the following sections.

In the representative environment 100, the communication device 110 may be a hand-held device, such as an MP3 player, a personal data assistant (PDA), a personal positioning system (e.g. GPS) unit, or any other mobile device. Similarly, the other devices 130 may include, for example, a computer 130A, another hand-held device 130B, and a cellular telephone 130C. In alternate implementations, of course, the devices 110, 130 may include any other suitable devices. Furthermore, it is understood that any of the other communication devices 130 may be equipped with upconversion PLL components 150 that operate in accordance with the teachings of the present disclosure, such as the cellular telephone 130C.

The infrastructure 120 may include a variety of suitable communication components operatively coupled to provide the desired telecommunications functionality. Various exemplary communication components of the infrastructure 120 are shown in FIG. 1 for illustrative purposes. For example, in some implementations, the infrastructure 120 may include one or more of the following: a communications satellite 122, an antenna tower 124, a communications dish 126, and one or more networks 128. Alternately, other communications components may be used. In particular implementations, the infrastructure 120 may include those components that make up a Core Network (CN) and a UMTS Terrestrial Radio Access Network (UTRAN) of a modern UMTS (Universal Mobile Telecommunication System). In further implementations, the infrastructure 120 may include components necessary for the transmission of FM radio signals to the devices 110, 130.

Figure 2:
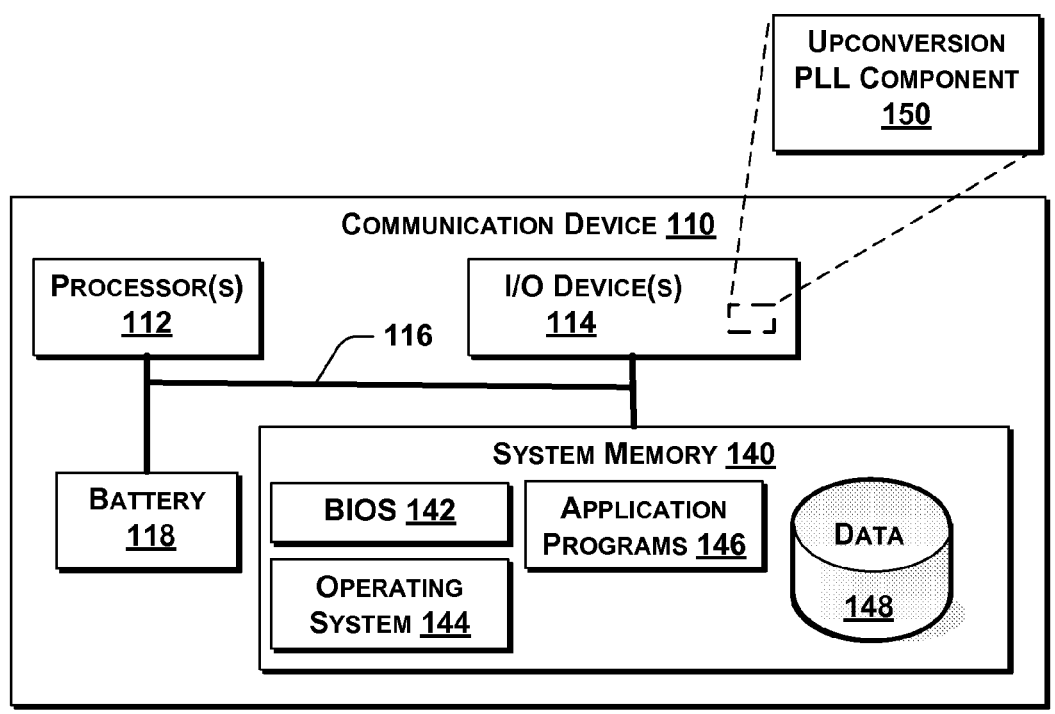
FIG. 2 is an exemplary mobile device having an upconversion phase-locked loop (PLL) component in accordance with the present disclosure.

FIG. 2 is an exemplary implementation of the mobile device 110 having the upconversion PLL component 150 in accordance with the present disclosure. Generally, the upconversion PLL component 150 may function as a frequency multiplier (as needed) which multiplies a reference input signal by a division ratio to produce a relatively higher frequency output signal.

In this implementation, the communication device 110 includes one or more processors 112 and one or more input/output (I/O) devices 114 coupled to a system memory 140 by a bus 116. A battery 118 provides power to the components of the communication device 110. In the implementation shown in FIG. 2, the upconversion PLL component 150 is depicted as being included within the I/O device 114. In alternate implementations, however, the upconversion PLL component 150 may be a separate, individual component of the device 110, or may be integrated with any other suitable portion of the device 110.

The system bus 116 represents any of the several types of bus structures, including a memory bus or memory controller, a peripheral bus, an accelerated graphics port, and a processor or local bus using any of a variety of bus architectures. The I/O device 114 may be configured to operatively communicate with one or more portions or components of the infrastructure 120 (e.g., Internet, intranet, cellular network, cable network, fiber optic network, infrared or radio antennas, LAN, WAN, etc.), or directly with other communication devices.

The system memory 140 may include computer-readable media configured to store data and/or program modules for implementing the techniques disclosed herein that are immediately accessible to and/or presently operated on by the processor 112. For example, the system memory 140 may also store a basic input/output system (BIOS) 142, an operating system 144, one or more application programs 146, and program data 148 that can be accessed by the processor 112 for performing various tasks desired by a user of the communication device 110.

Moreover, the computer-readable media included in the system memory 140 can be any available media that can be accessed by the device 110, including computer storage media and communication media. Computer storage media may include both volatile and nonvolatile, removable and non-removable media implemented in any method or technology for storage of information such as computer-readable instructions, data structures, program modules, or other data. Computer storage media includes, but is not limited to, and random access memory (RAM), read only memory (ROM), electrically erasable programmable ROM (EEPROM), flash memory or other memory technology, compact disk ROM (CD-ROM), digital versatile disks (DVD) or other optical disk storage, magnetic cassettes, magnetic tape, magnetic disk storage or other magnetic storage devices, or any other medium, including paper, punch cards and the like, which can be used to store the desired information and which can be accessed by the communication device 110.

Similarly, communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection and wireless media such as acoustic, RF, infrared and other wireless media. Combinations of any of the above should also be included within the scope of computer readable media.

Generally, program modules executed on the device 110 (FIG. 2) may include routines, programs, objects, components, data structures, etc., for performing particular tasks or implementing particular abstract data types. These program modules and the like may be executed as a native code or may be downloaded and executed such as in a virtual machine or other just-in-time compilation execution environments. Typically, the functionality of the program modules may be combined or distributed as desired in various implementations.

Although the exemplary environment 100 is shown as in FIG. 1 as a communication network, this implementation is meant to serve only as a non-limiting example of a suitable environment for use of the upconversion PLL component 150 in accordance with present disclosure. Similarly, the device 110 is simply one non-limiting example of a suitable device that may include an upconversion PLL component 150 in accordance with the present disclosure.

Exemplary Upconversion PLL Circuits

Structural and operational aspects of implementations of upconversion PLL circuits will now be described. Generally, the upconversion PLL circuits described herein may function as a frequency multiplier (as needed) which multiplies a reference input signal by a division ratio to produce a relatively higher frequency output signal. In the following discussion, it should be appreciated that unless otherwise specified, the described elements and components of the exemplary circuits are not necessarily limited to any particular configuration, and that in alternate implementations, these elements or components may be eliminated or substituted with other suitable elements or components to provide the desired functionality.

Figure 3:
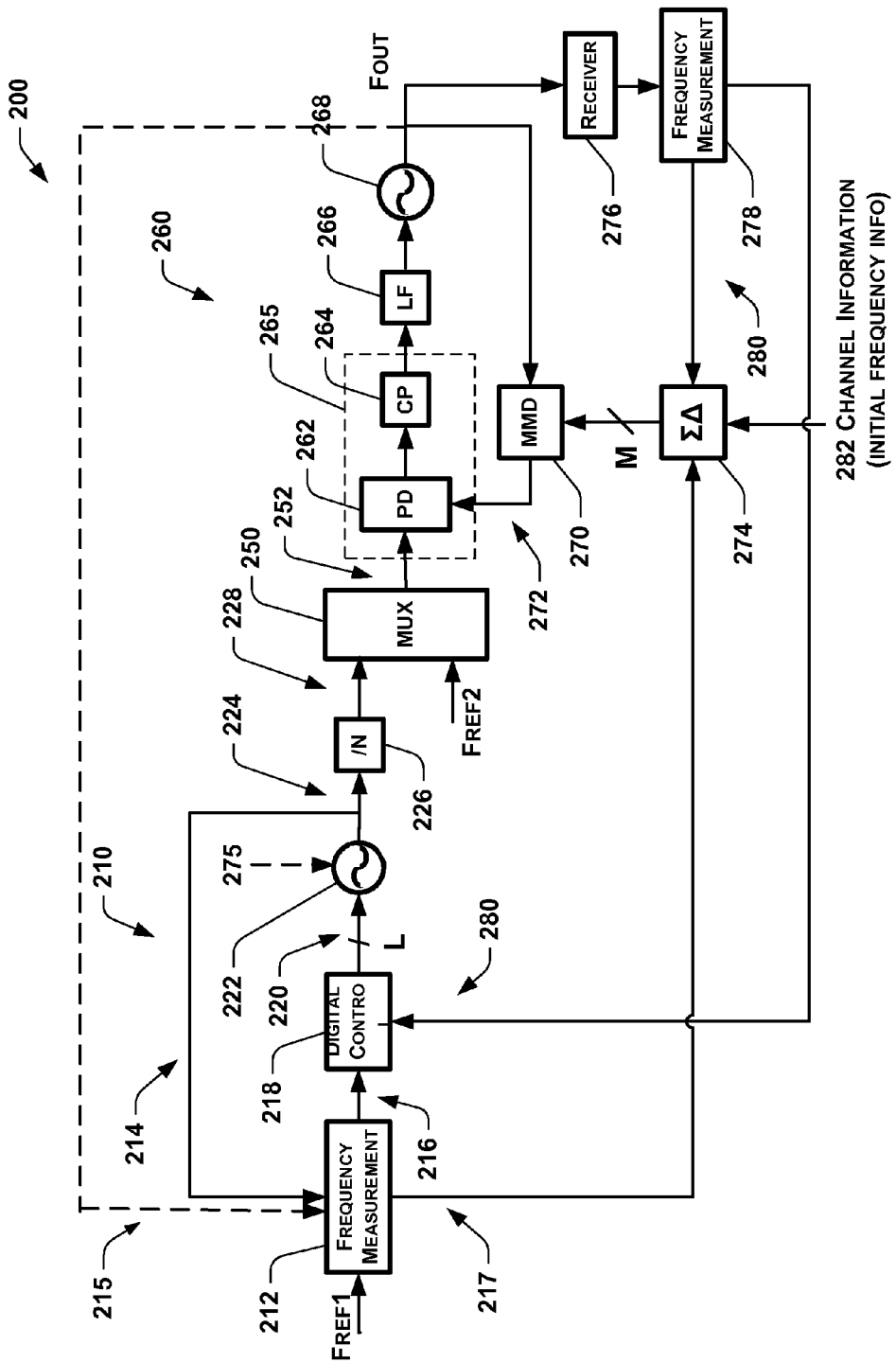
FIG. 3 is an exemplary upconversion PLL circuit in accordance with an implementation of the disclosure.

For example, FIG. 3 is an exemplary upconversion PLL circuit 200 in accordance with an implementation of the present disclosure. In this implementation, the upconversion PLL circuit 200 includes an FLL portion 210 and a PLL portion 260 coupled via a multiplexer 250 in a so-called "stacked" configuration. The upconversion PLL circuit 200 upconverts a low frequency reference $F_{ref1}$ to produce a relatively higher frequency phase-locked output $F_{out}$.

More specifically, the FLL portion 210 includes a frequency measurement (or frequency detector) component 212 that receives a low frequency reference $F_{ref1}$ and a first feedback signal 214. Optionally, the frequency measurement component 212 could also get a second feedback signal 215 from the PLL portion 260 if desired. The frequency measurement component 212 may be, for example, a counting structure that counts cycles, or any other suitable frequency measurement device, which might also do some additional digital processing to generate outputs (216, 217) described below. The frequency measurement component 212 provides an output 216 to a digital control 218 that represents a rough count (or measure) of the frequency difference between the low frequency reference $F_{ref1}$ and the first feedback signal 214 (and optionally may also determine a frequency difference with the second feedback signal 215). The frequency measurement component 212 also provides a fine-tuning frequency signal 217 to a sigma-delta modulator 274 that is indicative of a fine-tuning frequency information of the frequency difference. As used herein, the term "frequency information" generally includes a digital representation of a carrier (or channel) frequency, or a digital representation of a difference (or delta) between frequencies.

The digital control 218 receives the output 216 and provides a control signal 220 to a free running, digitally-controlled oscillator 222, to provide a high frequency intermediate output 224. In alternate implementations, however, the digital control 218 may be included in the frequency measurement component 212. The digitally-controlled oscillator 222 outputs a single frequency and needs only to be "rough" digitally controlled (e.g. L bits). The oscillator output 224 is provided to a frequency divider 226. The high frequency intermediate output 224 also serves as the first feedback signal 214 to the frequency measurement component 212.

The frequency divider 226 divides down (by "1/N") or otherwise reduces the frequency of the high frequency intermediate output 224 to provide a divided-down output 228 that may serve as a reasonable reference frequency for the PLL portion 260. In some implementations, the high frequency intermediate output 224 provided by the oscillator 222 may be suitable as the reference frequency for the PLL portion 260, and the divider 226 may be switched off or eliminated. The divided-down output 228 (or the high frequency intermediate output 224) is provided to a first input of the multiplexer 250 which couples the FLL portion 210 to the PLL portion 260.

As further shown in FIG. 3, a second (or "high") frequency reference $F_{ref2}$ may also be provided to the multiplexer 250. This may be a high frequency reference $F_{ref2}$ that is already available in the device 110. The multiplexer 250 determines which of the divided-down output 228 or the high frequency reference $F_{ref2}$ to provide to the PLL portion 260. For example, in some implementations, if the high frequency reference $F_{ref2}$ is unavailable or unsuitable, the multiplexer 250 passes the divided-down output 228. Alternately, in cases where the high frequency reference $F_{ref2}$ is available and suitable, the digitally-controlled oscillator 222 and divider 226 may be deactivated so that the PLL portion 260 will run exclusively on the high frequency reference $F_{ref2}$.

A multiplexed output 252 from the multiplexer 250 is provided to a phase detector (PD) 262 of the PLL portion 260. The phase detector 262 also receives a second input signal 272 as described more fully below. A charge pump (CP) 264 is coupled to the phase detector 262. Together, the phase detector 262 and charge pump 264 form a phase comparator 265 of the PLL portion 260. A loop filter 266 is coupled between the charge pump 264 and a voltage-controlled oscillator (VCO) 268. In alternate implementations, the phase detector 262 and charge pump 264 can be just a phase detector with voltage output connected to a suitable loop filter structure. A synthesized output frequency $F_{out}$ from the VCO 268 serves as the desired synthesized frequency of the upconversion PLL circuit 200.

In the implementation shown in FIG. 3, the synthesized output frequency $F_{out}$ is provided to a multi-modulus divider (MMD) 270 and to a receiver 276 coupled to a second frequency measurement component 278. The MMD 270 divides the synthesized output frequency $F_{out}$ of the VCO 268 and provides the second input signal 272 to the phase detector 262. The MMD 270 is controlled by the sigma-delta modulator 274 based on the fine-tuning frequency signal 217 from the frequency measurement component 212 of the FLL portion 210, a second measurement 280 from the second frequency measurement component 278 of the PLL portion 260, and an initial frequency information signal 282. The second frequency measurement 280 is also provided as a feedback signal to the digital control 218 of the FLL portion 210. The sigma-delta modulator 274 allows finer tuning of the synthesized output frequency $F_{out}$ than may be achieved using the FLL portion 210 and should correct the natural inaccuracy of the FLL portion 210.

In operation, the phase detector 262 compares the phases between the multiplexed output 252 from the multiplexer 250 and the feedback signal 272 from the MMD 270. In a locked condition, the input to the phase detector 262 (multiplexed output 252) has the same frequency and fixed phase relation as the synthesized output frequency $F_{out}$. In a non-locked condition, the phase detector 262 outputs a control signal to the charge pump 264 which generates, based on the control signal, a current for charging the loop filter 266. The loop filter 266, at a minimum, contains a low-pass filter for smoothing the output of the phase comparator 265, and provides the smoothed output to the VCO 268 until a locked or steady state condition may be achieved. In the locked or steady state of the PLL portion 260, the synthesized output frequency $F_{out}$ is upconverted from and phase-locked with the low frequency reference $F_{ref1}$.

Generally, the FLL portion 210 of the circuit 200 may serve as a "coarse" control portion of the frequency synthesis, and the PLL portion 260 of the circuit 200 may serve as a "fine" control portion of the frequency synthesis. More specifically, the FLL portion 210 may be roughly or coarsely controlled to generate a reference for the PLL portion 260 using the digitally-controlled oscillator 222 and the divider 226. Thus, the upconversion PLL circuit 200 may function as a frequency multiplier (as needed) which receives a relatively low frequency reference input signal ($F_{ref1}$ or $F_{ref2}$) to produce a relatively higher (or upconverted) frequency, phase-locked out signal ($F_{out}$).

Implementations of techniques in accordance with the present disclosure may provide considerable advantages over the prior art. For example, due to the fact that no real analog tuning range is needed, the phase noise behavior of the upconversion circuit may be improved, and current consumption can be reduced or minimized. Overall, implementations in accordance with the present disclosure may provide improvements in size (or area) needed for integration due to improvement in reducing phase noise, particularly for the low reference frequency in the audio bands.

It will be appreciated that, in alternate implementations, the FLL portion 210 of the upconversion PLL circuit 200 may be configured to be controllable to adjust the FLL portion 210, for example, due to degradation of the performance of the FLL portion 210. For example, in the event that the performance of the digitally-controlled oscillator 222 degrades over time, it may be desirable to controllably adjust the oscillator 222 (could also happen via digital control 218), such as by using a secondary control signal 275 from a suitable portion or component (e.g. the sigma-delta modulator 274) of the circuit 200 or device 110.

It may be noted that the PLL portion 260 of the upconversion PLL circuit 200 has been described with reference to FIG. 3 as an analog PLL scheme. In alternate implementations, however, the PLL portion 260 may be implemented as a digital PLL portion.

Figure 4:
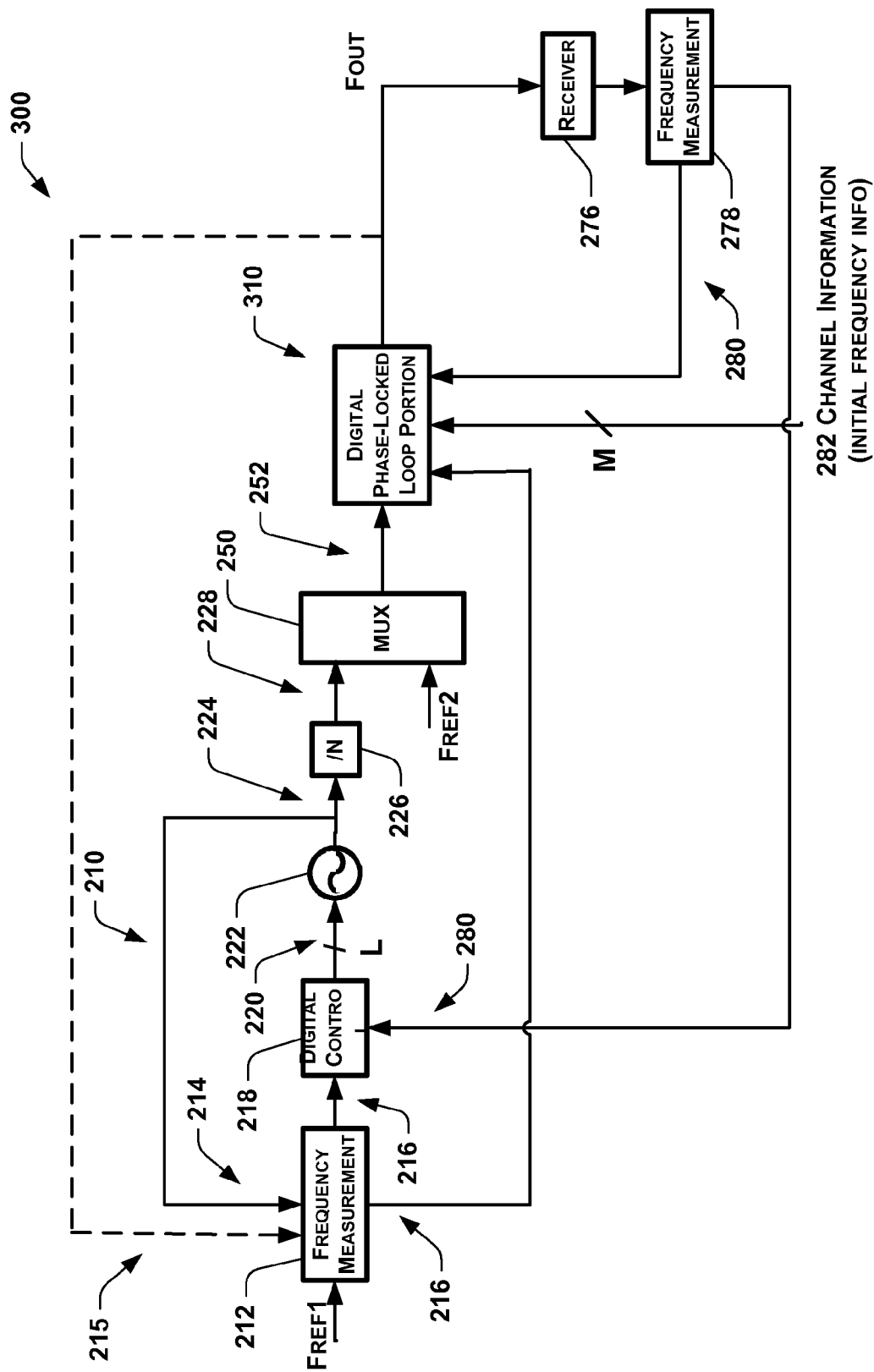
FIG. 4 is an exemplary upconversion PLL circuit in accordance with another implementation of the disclosure.

For example, FIG. 4 is an exemplary upconversion PLL circuit 300 having in accordance with another implementation of the present disclosure. In this implementation, the upconversion PLL circuit 300 includes an FLL portion 210 and a digital PLL portion 310. Some portions of the upconversion PLL circuit 300 may operate substantially as described above (e.g. FLL portion 210), and therefore, a detailed description of those portions will not be repeated.

In this implementation, the digital PLL portion 310 receives the output 252 from the multiplexer 250, and is controlled directly by the different signals to provide the synthesized output frequency $F_{out}$. The digital PLL portion 310 may be configured in a variety of possible implementations. For example, in some implementations, the digital PLL portion 310 may be configured using a direct digital synthesis (DDS) component, as generally disclosed in the article "*Direct Digital Synthesis Enables Digital PLLs*" by P. Kern, published at www.rfdesign.com. Alternately, the digital PLL portion 310 may be implemented as generally disclosed, for example, in U.S. Pat. No. 7,292,110 issued to Lee, U.S. Pat. No. 7,245,687 issued to Chang, and U.S. Pat. No. 6,005,427 issued to Morishima.

Thus, implementations of upconversion PLL circuits having a digital PLL portion in accordance with the present disclosure may provide the above-noted advantages of improved phase noise behavior, reduced current consumption, and reduced integration area, and other advantages associated with digital PLLs. For example, implementations having a digital PLL may provide improved resistance to thermal noise, aging, drift, and charge pump mismatch or leakage in comparison with analog implementations. Such implementations may also provide improved versatility since loop parameters of the digital PLL portion may be adjusted by merely programming registers rather than changing components as may be required by analog PLLs. In general, analog PLLs may present an attractive alternative in systems where reference switching and loop reconfiguration are not necessary, while digital PLLs may be preferable in systems where smooth switching, holdover, and well-controlled loop dynamics are required.

Exemplary Frequency Synthesis Processes

Exemplary processes for frequency synthesis in accordance with the present disclosure will now be described. For simplicity, the processes will be described with reference to the exemplary implementations described above with reference to FIGS. 1-4. The exemplary processes may be illustrated as a collection of blocks in a logical flow graph, which represents a sequence of operations that can be implemented in hardware, software, or a combination thereof. In the context of software, the blocks may represent computer instructions that, when executed by one or more processors, perform the recited operations.

Figure 5:
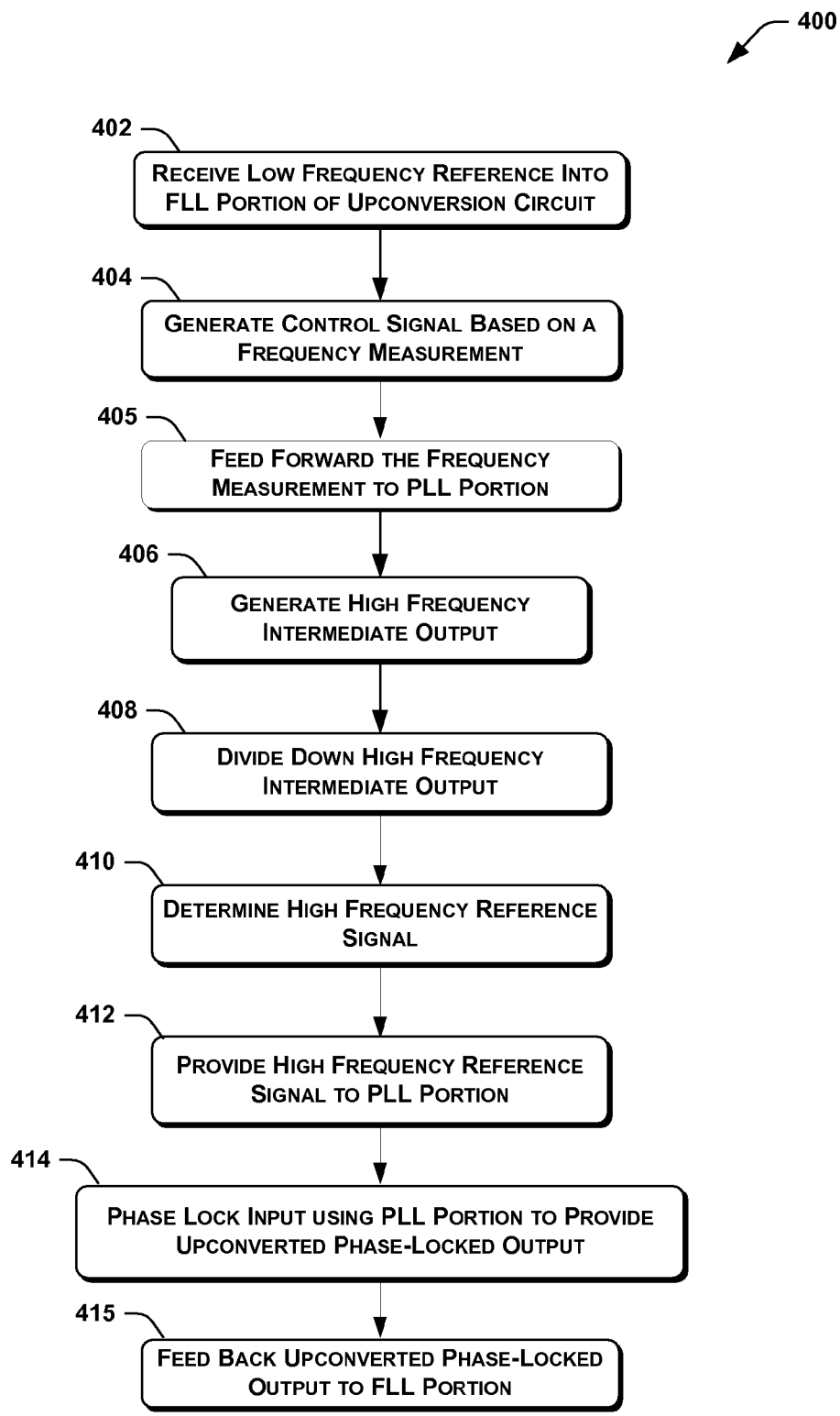
FIG. 5 is a flowchart of a process for frequency synthesis using an upconversion PLL process in accordance with an implementation of the present disclosure.

More specifically, FIG. 5 is a flowchart of a process 400 for frequency synthesis in accordance with an implementation of the present disclosure. In this implementation, a low frequency reference is received into an FLL portion of a frequency synthesis circuit at 402. A control signal is generated based on a frequency measurement of the low frequency reference at 404. In some implementations, the frequency measurement may be fed forward at 405 to a PLL portion of the frequency synthesis circuit for use in a phase-locking operation, as described more fully below. A high frequency intermediate output is generated based on the control signal at 406. In some implementations, the high frequency intermediate output is generated using a free running digitally-controlled oscillator.

The high frequency intermediate output may be divided down or otherwise reduced at 408. For example, the high frequency intermediate output may be divided down using a divider which divides the low frequency output by an appropriate factor (e.g. "1/N"). Alternately, in some implementations, the high frequency intermediate output may be suitable as the reference frequency for the PLL portion, and the dividing down (at 408) may be switched off or eliminated. At 410, a high frequency reference signal suitable for input to a PLL portion is determined. For example, in some implementations, the signal from the FLL portion is multiplexed with a high frequency reference signal that is already available within a device or system.

After the high frequency reference signal is determined at 410, it is input to the PLL portion of the frequency synthesis circuit at 412. At 414, the high frequency reference signal is phase locked by the PLL portion to provide a phase-locked output. In some implementations, the phase locking at 414 may be accomplished using an analog PLL circuit. Alternately, the phase locking may be performed using a digital PLL circuit.

Furthermore, in some implementations, the phase locking performed by the PLL portion may be at least partially based on a frequency measurement fed forward from the FLL portion, and a second frequency measurement of the upconverted phase-locked output. In a particular embodiment, the phase locking may be controlled by a multi-modulus divider (MMD) based on the frequency measurement from the FLL portion and the second frequency measurement of the phase-locked output.

The phase-locked output may be the desired synthesized frequency to be generated by the process 400. The phase-locked output may be fed back to the FLL portion to be used for generating the low frequency output at 415. For example, in some implementations, the phase-locked output may be fed back to a free running digitally-controlled oscillator of the FLL portion.

The process 400 shown in FIG. 5 is one of many possible implementations in accordance with the teachings of the present disclosure. For example, in alternate implementations, certain acts need not be performed in the order described, and may be modified, and/or may be omitted entirely, depending on the circumstances. Moreover, in various implementations, the acts described may be implemented by a computer, processor, or other computing device based on instructions stored on one or more computer-readable media. The computer-readable media can be any available media that can be accessed by a computing device to implement the instructions stored thereon.

As noted above, techniques for frequency synthesis using upconversion PLL circuits in accordance with the present disclosure may advantageously improved phase noise behavior, reduced current consumption, and reduced integration area in comparison with conventional methods. In addition, some implementations of frequency synthesis techniques that employ a digital PLL may also provide improved resistance to thermal noise, aging, drift, and other aspects of analog PLL operations.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

We claim:

1. A circuit, comprising:
 a frequency-locked loop portion configured to receive an input frequency and to generate an upconverted intermediate frequency and a frequency information indicative of a needed frequency correction of a frequency-locked loop output frequency;
an intermediate portion configured to receive the upconverted intermediate frequency and a reference frequency, and further configured to provide an intermediate output that is either the upconverted intermediate frequency or the reference frequency; and
a phase-locked loop portion configured to receive the intermediate output and to generate a phase-locked output frequency based on the frequency information.

2. The circuit of claim 1, wherein the frequency-locked loop portion includes a digitally-controlled oscillator configured to generate the upconverted intermediate frequency.

3. The circuit of claim 2, wherein the frequency-locked loop portion includes a digital control coupled to the digitally-controlled oscillator to provide a control signal to the digitally-controlled oscillator based on a frequency measurement derived out of the input frequency.

4. The circuit of claim 1, wherein the phase-locked loop portion includes an analog phase-locked loop having:
a phase comparator configured to receive the intermediate output and a phase adjustment signal; and
a multi-modulus divider coupled to the phase comparator and configured to provide the phase adjustment signal based at least partially on the frequency information.

5. The circuit of claim 4, further comprising a sigma delta modulator coupled to receive the frequency information and to provide a control signal to the multi-modulus divider based at least partially on the frequency information.

6. The circuit of claim 5, wherein the phase comparator includes a phase detector coupled to receive the phase adjustment signal, and a charge pump coupled to generate a charging current, and wherein the analog phase-locked loop further includes:
a loop filter coupled to receive the charging current and to output a smoothed voltage; and
a voltage controlled oscillator configured to receive the smoothed voltage and to provide the phase-locked output frequency.

7. The circuit of claim 1, wherein the phase-locked loop portion includes a digital phase-locked loop.

8. The circuit of claim 7, further comprising a first frequency measurement component of the frequency-locked loop portion configured to provide the frequency information to the digital phase-locked loop and a second frequency measurement component configured to provide a measurement of the phase-locked output frequency to the digital phase-locked loop.

9. The circuit of claim 1, wherein the intermediate portion includes a multiplexer.

10. An electronic device, comprising:
a processor; and
a communication component operatively coupled to the processor and configured to at least one of receive and transmit communication signals, the communication component including a frequency synthesizer component having:
a frequency-locked loop portion configured to receive an input frequency and to generate an upconverted intermediate frequency and a frequency information indicative of a frequency correction;
an intermediate portion coupled to the frequency-locked loop portion and configured to receive the upconverted intermediate frequency and a reference frequency, and further configured to provide an intermediate output that is either the upconverted intermediate frequency or the reference frequency; and
a phase-locked loop portion coupled to the intermediate portion and configured to receive the intermediate output and to generate a phase-locked output frequency based on the frequency information.

11. The device of claim 10, wherein the frequency-locked loop portion includes a digitally-controlled oscillator configured to generate the upconverted intermediate frequency, and wherein the phase-locked loop portion includes a voltage controlled oscillator configured to provide the phase-locked output frequency.

12. The device of claim 11, wherein the frequency-locked loop portion includes a digital control coupled to provide a control signal to the digitally-controlled oscillator based on a frequency measurement of the input frequency.

13. The device of claim 11, further comprising a sigma delta modulator coupled to receive the frequency information and to provide a control signal to the phase-locked loop based at least partially on the frequency information.

14. The device of claim 10, wherein the frequency-locked loop portion is further configured to deactivate generation of the upconverted intermediate frequency when reference frequency is adequate and the intermediate portion outputs the reference frequency.

15. A method, comprising:
receiving a low frequency input;
providing an upconverted intermediate signal;
providing a frequency information indicative of a frequency correction;
selecting one of the upconverted intermediate signal and a high frequency reference; and
frequency-locking the selected upconverted intermediate signal or the high frequency reference based on the frequency information to provide an upconverted phase-locked output.

16. The method of claim 15, wherein providing an upconverted intermediate signal includes controlling an oscillator to generate the upconverted intermediate signal based on a frequency measurement of the low frequency input.

17. The method of claim 16, wherein the oscillator generates an oscillator output, the method further comprising dividing down the oscillator output to generate the upconverted intermediate signal.

18. The method of claim 15, wherein frequency locking the selected upconverted intermediate signal or the high frequency reference includes:
receiving the frequency information into a control component; and
adjusting a phase-locked loop using a control signal from the control component.

19. The method of claim 18, wherein adjusting the phase-locked loop includes adjusting a digital phase-locked loop.

20. The device of claim 8, wherein the second frequency measurement component is configured to provide the measurement of the phase-locked output frequency to a digital control of the frequency-locked loop portion.

* * * * *